(12) United States Patent
Mahdi et al.

(10) Patent No.: US 9,003,257 B1
(45) Date of Patent: Apr. 7, 2015

(54) LOW DENSITY PARITY CHECK ENCODER AND ENCODING METHOD

(71) Applicant: Antcor S.A., Athens (GR)

(72) Inventors: Ahmed S Mahdi, Patras (GR); Nikolaos L Kanistras, Patras (GR); Vassilis Paliouras, Patras (GR)

(73) Assignee: u-blox AG (CH)

( * ) Notice: Subject to any disclaimer, the term of this patent is extended or adjusted under 35 U.S.C. 154(b) by 14 days.

(21) Appl. No.: 14/031,505

(22) Filed: Sep. 19, 2013

(51) Int. Cl.
H03M 13/00 (2006.01)
H03M 13/11 (2006.01)

(52) U.S. Cl.
CPC .................................. *H03M 13/1102* (2013.01)

(58) Field of Classification Search
USPC .......................................... 714/752, 755, 758
See application file for complete search history.

(56) References Cited

U.S. PATENT DOCUMENTS

| | | | |
|---|---|---|---|
| 7,992,066 B2 * | 8/2011 | Oh et al. ......................... | 714/752 |
| 8,347,169 B1 | 1/2013 | Acikel | |
| 8,448,041 B1 * | 5/2013 | Zeng et al. ..................... | 714/758 |
| 8,539,304 B1 * | 9/2013 | Shirali et al. .................... | 714/758 |
| 2006/0064627 A1 * | 3/2006 | Berens et al. .................. | 714/790 |
| 2008/0256425 A1 * | 10/2008 | Oh et al. ......................... | 714/801 |
| 2009/0164762 A1 | 6/2009 | Huang et al. | |
| 2010/0115371 A1 * | 5/2010 | Shen et al. ...................... | 714/752 |
| 2010/0251059 A1 * | 9/2010 | Dielissen ........................ | 714/752 |
| 2010/0281330 A1 | 11/2010 | Blanksby et al. | |

OTHER PUBLICATIONS

Perez, J.M.; Fernandez, V., "Low-cost encoding of IEEE 802.11n," Electronics Letters, vol. 44, No. 4, pp. 307-308, Feb. 14, 2008.
Yongmin Jung; Chulho Chung; Jaeseok Kim; Yunho Jung, "7.7Gbps encoder design for IEEE 802.11n/ac QC-LDPC codes," SoC Design Conference (ISOCC), 2012 International, vol., no., pp. 215,218, 4-7, Nov. 2012.
Cai, Z.; Hao, J.; Tan, P.H.; Sun, S.; Chin, P. S., "Efficient encoding of IEEE 802.11n LDPC codes," Electronics Letters, vol. 42, No. 25, pp. 1471,1472, Dec. 7, 2006.
Chia-Yu Lin; Chih-Chun Wei; Mong-Kai Ku, "Efficient encoding for dual-diagonal structured LDPC codes based on parity bit prediction and correction," IEEE Asia Pacific Conference on Circuits and Systems, 2008. APCCAS 2008., vol., no., pp. 1648,1651, Nov. 30, 2008-Dec. 3, 2008.
802.11n / 802.11ac LDPC Encoder, Data sheet, Doc Ref: BRC014_LdpcEncRtIDs, Blue Rum Consulting, Feb. 21, 2013.

(Continued)

*Primary Examiner* — Sam Rizk
(74) *Attorney, Agent, or Firm* — Westberg Law Offices

(57) ABSTRACT

The present invention is directed toward a parity check encoder for low density error correction codes and to an encoding method. In accordance with an embodiment, an encoder for error correction coding comprises: first hardware resources configured to receive a message bits vector and to compute an intermediate parity bits vector from the message bits vector wherein the intermediate parity bits vector is computed based on a sub-matrix of a parity check matrix; and second hardware resources configured to compute a parity bits vector from the intermediate parity bits vector, wherein the second hardware resources are configured to compute parity bits for multiple different codes, and wherein portions of the hardware resources that are configured to compute the parity bits for a particular one of the codes are commonly shared with portions of the hardware resources that are configured to compute the parity bits for another particular one of the codes.

22 Claims, 8 Drawing Sheets

(56) References Cited

OTHER PUBLICATIONS

IEEE 802.11n/ac LDPC CODEC, Analogies S.A., accessed at <http://www.analogies.us/downloads/Products/ECC-FEC/ieee80211n_ac_ldpc_product_brief_20120419_v1%201.pdf> on Jul. 20, 2013.

Gustafsson, O.; Wanhammar, L., "ILP modelling of the common subexpression sharing problem," 9th International Conference on Electronics, Circuits and Systems, 2002., vol. 3, no., pp. 1171,1174 vol. 3, 2002.

Tummeltshammer, P.; Hoe, J.C.; Puschel, M., "Time-Multiplexed Multiple-Constant Multiplication," IEEE Transactions on Computer-Aided Design of Integrated Circuits and Systems, vol. 26, No. 9, pp. 1551,1563, Sep. 2007.

R. M. Gray, Toeplitz and Circulant Matrices: A review, ser. Foundations and Trends in Communications and Information Theory, vol. 2, No. 3., 2006.

Richardson, T.J.; Urbanke, R.L., "Efficient encoding of low-density parity-check codes," IEEE Transactions on Information Theory, vol. 47, No. 2, pp. 638,656, Feb. 2001.

Chanho Yoon; Eunyoung Choi; Minho Cheong; Sok-Kyu Lee, "Arbitrary Bit Generation and Correction Technique for Encoding QC-LDPC Codes with Dual-Diagonal Parity Structure," Wireless Communications and Networking Conference, 2007.WCNC 2007. IEEE, vol., no., pp. 662,666, Mar. 11-15, 2007.

International Search Report and Written Opinion, issued in connection with Int'l application No. PCT/EP2014/002544, dated Dec. 10, 2015, pp. 1-10.

\* cited by examiner

Parity Check Matrix H $(H_2^T)^{-1}$ sub-matrix of a (648,108) code $(H_2^T)^{-1}$ sub-matrix of a (648,324) code

LOW DENSITY PARITY CHECK ENCODER AND ENCODING METHOD

BACKGROUND OF THE INVENTION

The present invention relates to the field of error correction coding and decoding. More particularly, the present invention relates to Low Density Parity Check (LDPC) codes and to an LDPC encoder.

The process of transmitting digital data can introduce errors into the data. As a result, the received data can be different from the transmitted data. Such errors are typically caused by noise that is present in the transmission channel. The amount of errors is generally related to the transmission signal strength in relation to the amount of noise present. Error correction coding is a technique by which redundancy is inserted into the data prior to transmission. Upon reception, this redundancy is used in an attempt to correct errors that were introduced during the transmission process.

Block coding is a type of error correction coding in which the digital data to be transmitted is broken into messages of fixed size. Prior to transmission, each message is encoded into a codeword (also referred to as a "block") by an encoder. Redundancy, referred to as parity data, is inserted during the encoding process so that the codewords are made larger than the messages. Each codeword includes both message bits and parity bits. Assume that the codewords each consist of n bits. Only certain patterns of n bits are valid codewords; the remaining patterns are invalid. The codewords are then transmitted, which may cause the codewords to become corrupted. Upon reception, a decoder attempts to infer the original messages from the received, and possibly corrupted, codewords.

A generator matrix can be used during the encoding process to encode the messages into valid codewords. Upon reception, a parity check matrix can be used during the decoding process to generate an error vector, where the error vector indicates the presence of errors in the received codeword.

A linear block error correction code is one in which any linear combination of valid codewords is also a valid codeword. Low Density Parity Check (LDPC) codes are a subcategory of linear block error correction codes characterized by a sparse parity check matrix. This means that the parity check matrix consists mainly of 0's and a relatively small number of 1's. LDPC codes were first introduced in the 1960's but have more recently received increased attention. This is due at least in part to inherent parallelism in decoding which makes LDPC codes suitable for hardware implementation and due to flexibility in designing LDPC codes, which allows LDPC codes to be used in a variety of applications. A number of telecommunications standards use a set of LDPC codes having a variety of block lengths and code rates. The code rate can be defined as the portion of non-redundant data contained in each block.

The generator matrix for LDPC codes is generally not sparse. This means that the encoding process for an LDPC code can have high complexity. In an effort to reduce encoding complexity, some encoding schemes use the parity check matrix to compute the codewords during the encoding process. This is possible because the parity check matrix is related to the generator matrix in that the parity check matrix for each particular LDPC code can be derived from the generator matrix for that code. The parity check matrix can be partitioned into sub-matrices. The parity bits for each codeword can be computed from the message bits using the sub-matrices.

Some LDPC encoders employ backward substitution. This approach is used to avoid inversion of the parity check sub-matrix in an effort to reduce complexity of the encoding computations. However, parallelization of the backward substitution procedure introduces high complexity. Also, to implement the backward substitution procedure for LDPC codes having different of block lengths and code rates, at least the non-zero elements for multiple sub-matrices need to be stored (i.e. one per code length, per code rate), which requires large memories. In addition to the storage requirements, implementation of these procedures tends to require complex hardware.

SUMMARY OF THE INVENTION

The present invention is directed toward a parity check encoder for low density error correction codes and to an encoding method. In accordance with an embodiment, an encoder for error correction coding comprises: first hardware resources configured to receive a message bits vector and to compute an intermediate parity bits vector from the message bits vector wherein the intermediate parity bits vector is computed based on a sub-matrix of a parity check matrix; and second hardware resources configured to compute a parity bits vector from the intermediate parity bits vector, wherein the second hardware resources are configured to compute parity bits for multiple different codes, and wherein portions of the hardware resources that are configured to compute the parity bits for a particular one of the codes are commonly shared with portions of the hardware resources that are configured to compute the parity bits for another particular one of the codes.

In accordance with a further embodiment, a method of encoding an error correction code comprises: computing an intermediate parity bits vector from a message bits vector using a sub-matrix of a parity check matrix; and computing a parity bits vector from the intermediate parity bits vector using fixed hardware resources that are configured to compute parity bits for multiple different codes and wherein portions of the hardware resources that are configured to compute the parity bits for a particular one of the codes are commonly shared with portions of the hardware resources that are configured to compute the parity bits for another particular one of the codes.

BRIEF DESCRIPTION OF THE DRAWINGS

The present invention is described with respect to particular exemplary embodiments thereof and reference is accordingly made to the drawings in which.

DETAILED DESCRIPTION OF A PREFERRED EMBODIMENT OF THE INVENTION

The present invention exploits particular features of a set of error correction codes in order to reduce storage and hardware complexity requirements of an encoder. Embodiments of the present invention allow the same encoder hardware to perform encoding for different block lengths and code rates. Thus, hardware resources of the encoder can be shared among the different block lengths and code rates supported by the encoder. Embodiments of the present invention are useful for encoding low density parity check (LDPC) codes.

Figure 1:
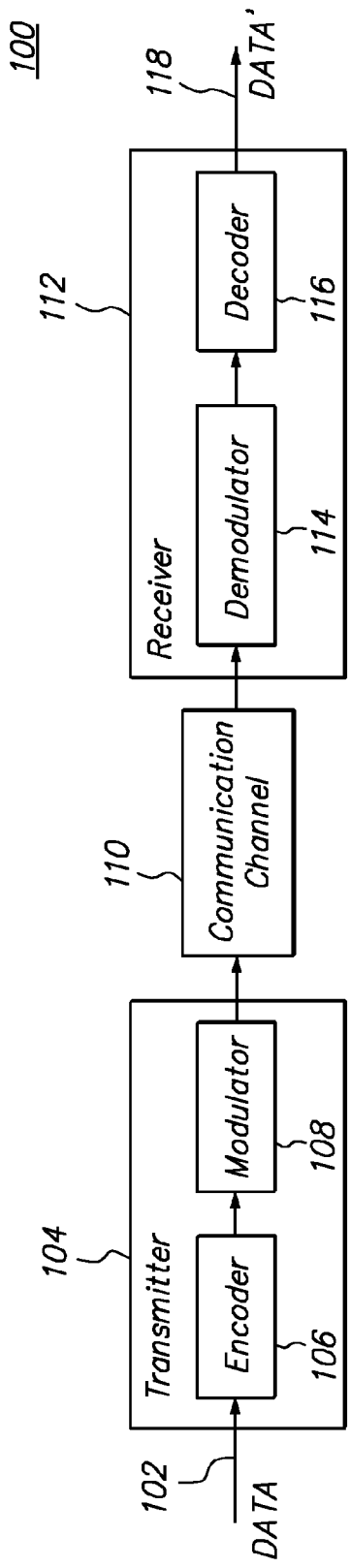
FIG. 1 illustrates a communication system in which embodiments of the present invention can be implemented.

FIG. 1 illustrates a communication system 100 in which embodiments of the present invention can be implemented. As shown in FIG. 1, digital data 102 to be transmitted is input to a transmitter 104. The transmitter 104 can include an encoder 106 and a modulator 108. The encoder 106 performs error correction coding on the data, for example, by breaking the data 102 into messages of fixed size and encoding the messages into codewords. Redundancy, in the form of parity bits, is inserted during the encoding process so that the codewords are made larger than the messages.

The modulator 108 can then prepare the codewords for transmission by modulating one or more carrier signals in accordance with the codewords. As an example, the modulation can be performed in accordance with orthogonal frequency division multiplexing (OFDM). Each modulated and encoded signal can then be transmitted via a communication channel 110. The channel 110 can be, for example, a wireless communication channel which can be, for example, part of a wireless local area network (WLAN).

A receiver 112 receives the transmitted signal from the channel 110. The receiver 112 can include a demodulator 114 and a decoder 116. The demodulator 114 demodulates the received signal to reconstruct the codewords. The codewords can then be decoded by the decoder 116 in order to reconstruct the original data 102. While the decoder 116 can correct certain errors introduced by the communication process, the data 118 output from the decoder 112 can differ from the original data 102 due to uncorrected errors that remain.

Figure 2:
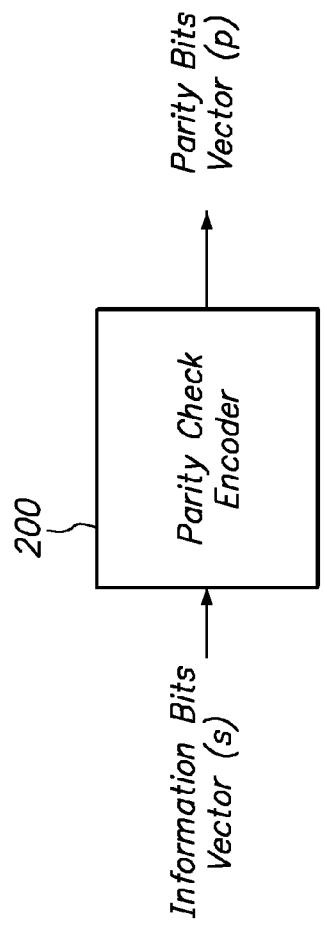
FIG. 2 illustrates a parity check encoder in accordance with an embodiment of the present invention.

FIG. 2 illustrates a parity check encoder 200 in accordance with an embodiment of the present invention. The parity check encoder 200 can be included in the encoder 106 of FIG. 1. The parity check encoder 200 receives an information bits vector s. The information bits vector s contains message bits. The parity check encoder 200 uses the message bits to produce a parity bits vector p. The parity bits vector p contains parity bits that correspond to the message bits input to the encoder 200. The encoder 106 of FIG. 1 may perform functions that are in addition to that of the parity check encoder 200. For example, the encoder 106 may perform padding in which bits are added to the message bits prior to computing the parity check bits. The encoder 106 may perform puncturing and repeating after computing the parity check bits. The padding, puncturing and repeating can be, for example, performed in accordance with IEEE 802.11n/ac standards. Portions of the encoder 106, including the parity check encoder 200, can be implemented in hardware using field programmable gate arrays (FPGAs), application specific integrated circuits (ASICs) or other types of circuitry.

The parity bits of a codeword in accordance with LDPC encoding can be defined by the following Equation (1):

$$p = s \cdot H_1^T \cdot (H_2^T)^{-1}. \tag{1}$$

where s is the information bits vector, p is the parity bits vector, $H_1^T$ and $H_2^T$ are the transposed $H_1$ and $H_2$, which are two sub-matrices of the parity check matrix H of the code.

Figure 3:
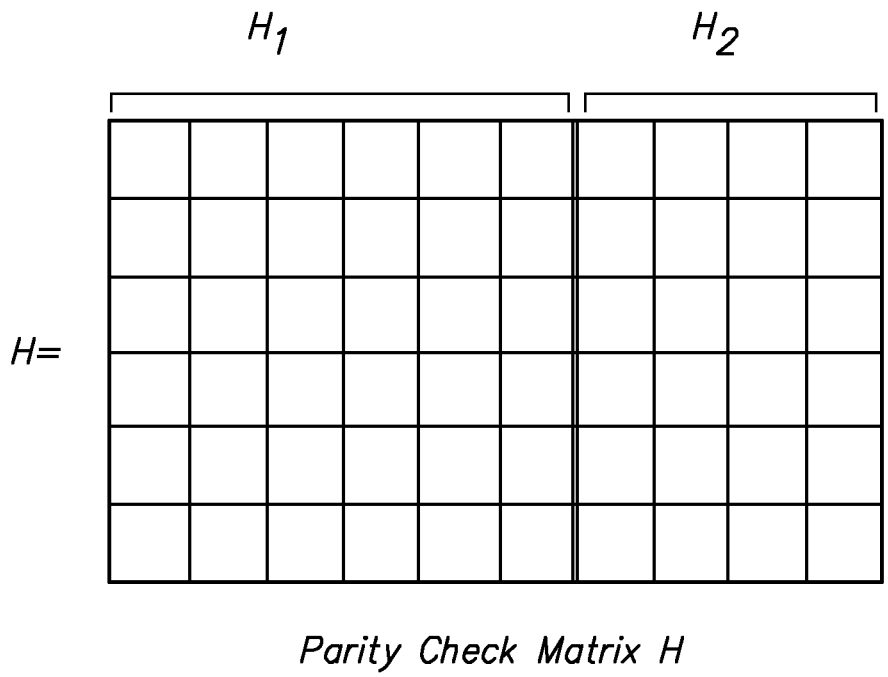
FIG. 3 illustrates partitioning of a parity check matrix in accordance with an embodiment of the present invention.

Thus, the parity check matrix H can be partitioned into two sub-matrices $H_1$ and $H_2$, which are transposed to form the matrices $H_1^T$ and $H_2^T$. FIG. 3 illustrates partitioning of a parity check matrix H into two sub-matrices $H_1$ and $H_2$ in accordance with an embodiment of the present invention.

A two-step encoding algorithm can be used to implement Equation (1), according to Equations (2) and (3):

$$p_1 = s \cdot H_1^T. \tag{2}$$

$$p = p_1 \cdot (H_2^T)^{-1}. \tag{3}$$

where $p_1$ is an intermediate parity bits vector and $(H_2^T)^{-1}$ is the inversion of sub-matrix $H_2^T$.

Figure 4:
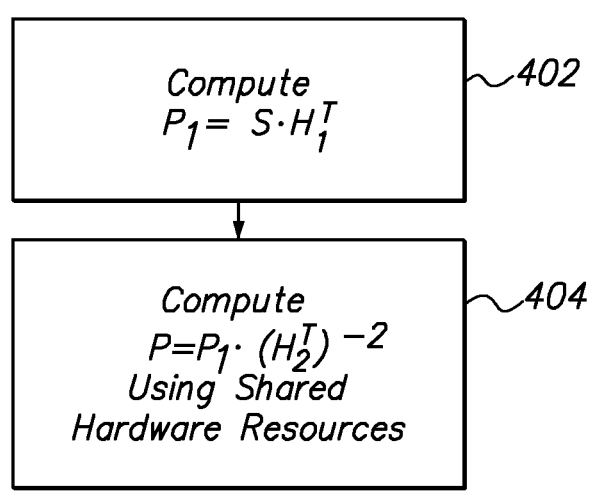
FIG. 4 illustrates a method of computing parity check bits in accordance with an embodiment of the present invention.

FIG. 4 illustrates a method 400 of computing parity bits in accordance with an embodiment of the present invention. The method 400 can be performed by the parity check encoder 200 of FIG. 2. In a step 402, an intermediate parity bits vector $p_1$ is computed. The intermediate parity bits vector $p_1$ can be computed in step 302 in accordance with Equation (2) above. In a step 404, the parity bits vector p is computed. The parity bits vector p can be computed in accordance with Equation (3) above.

The steps 402 and 404 comprise the multiplication of a row-vector by two unique matrices. For the case of binary codes, the parity check matrices are binary also. Therefore, Equations (2) and (3) can be implemented in a GF(2) (i.e. a Galois field of two elements) and their computational complexity is proportional to the total number of ones in both matrices $H_1^T$ and $(H_2^T)^{-1}$. The sub-matrix $H_1^T$ is sparse; while due to the inversion operation, the inverted matrix $(H_2^T)^{-1}$ is generally quite dense.

For the case that H is Quasi-Cyclic (QC), composed of z×z circulant sub-matrices and z×z zero sub-matrices, the resulted inverted matrix $(H_2^T)^{-1}$ is also composed of z×z circulant sub-matrices and z×z zero sub-matrices; however, it is denser than the $H_2^T$ matrix. The density of $H_1^T$ is low because it is a sub-matrix of H, which is sparse. Therefore, the computation of Equation (3) is more involved than that of Equation (2).

In a system that supports several codes of different block lengths and/or different code rates, the different codes can have common parts among the columns of their parity check matrices. In this case, it has been found that the $(H_2^T)^{-1}$ sub-matrices can have common parts among their columns also. Particularly, in the case the following two features are met by the structure of the parity check matrices, namely, all of the parity check matrices are binary and QC, and the $H_2^T$ sub-matrices have dual-diagonal structure, then it has been observed that the overlap among the columns of the $(H_2^T)^{-1}$ sub-matrices is proportional to the overlap among the corresponding $H_2^T$ sub-matrices. Codes having these two features are referred to as supported codes.

Figure 5:
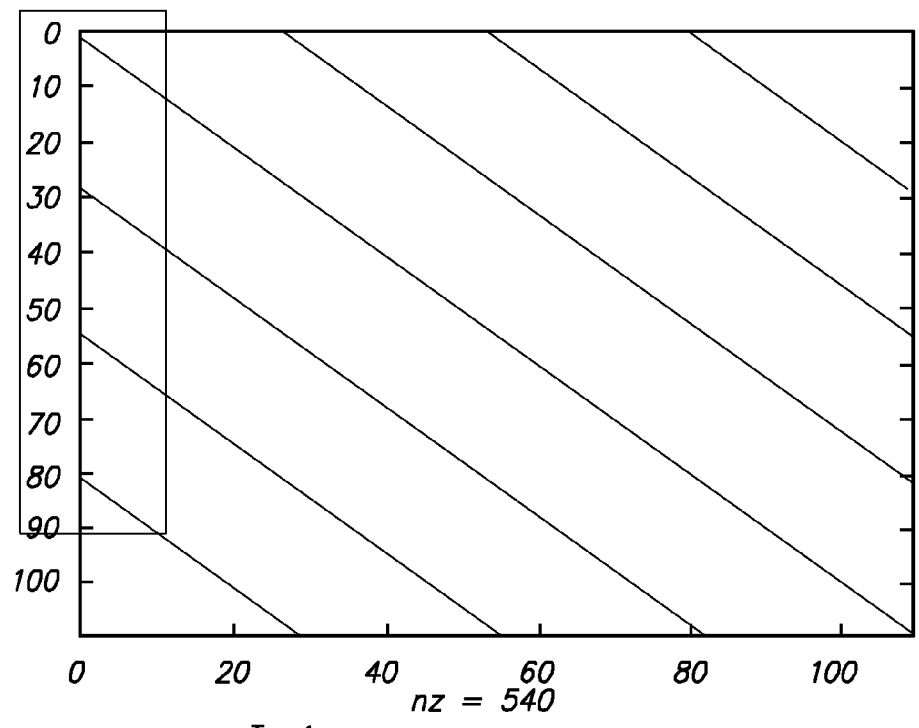
FIG. 5 illustrates the inverse of the transpose of a parity check sub-matrix for a particular error correction code in accordance with an embodiment of the present invention.
Figure 6:
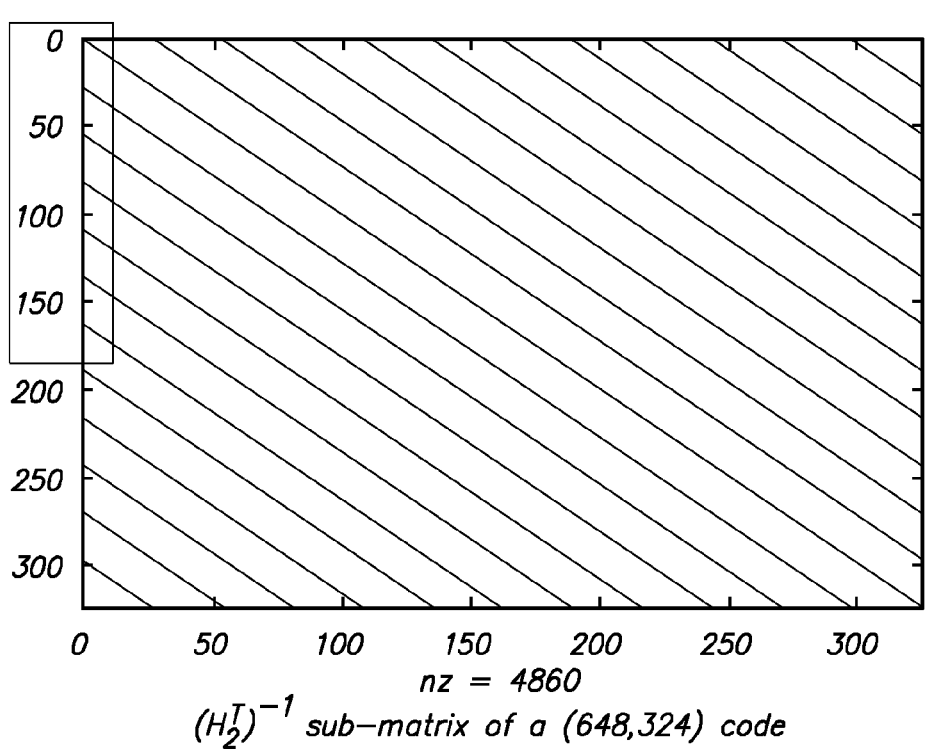
FIG. 6 illustrates the inverse of the transpose of a parity check sub-matrix for an alternative error correction code in accordance with an embodiment of the present invention.

FIG. 5 illustrates a parity check sub-matrix for a particular LDPC error correction code having a block length of 648 and a rate of ⅚. FIG. 6 illustrates a parity check sub-matrix for a second LDPC error correction code having a block length of 648 and a rate of ½. FIGS. 5 and 6 show where the marked rows of the $(H_2^T)^{-1}$ sub-matrix for the first code are encountered at the $(H_2^T)^{-1}$ sub-matrix of the second code.

Referring again to FIG. 4, step 402 can be implemented with hardware, such as field programmable gate arrays (FPGAs), application specific integrated circuits (ASICs) or other types of circuitry that performs vector matrix multiplication.

Step 404 can be implemented in hardware using XOR-gate trees. In this case, the common parts among the $(H_2^T)^{-1}$ sub-matrices of the supported codes correspond to common parts among the trees of XOR gates that implement the encoding of these codes. This is a sub-expressions problem and is exploited by the invention to share hardware resources, resulting to reduction of the encoder hardware requirements. Therefore, step 404 is performed using shared XOR resources. Such XOR resources can be implemented as field programmable gate arrays (FPGAs), application specific integrated circuits (ASICs) or other types of circuitry.

Figure 7:
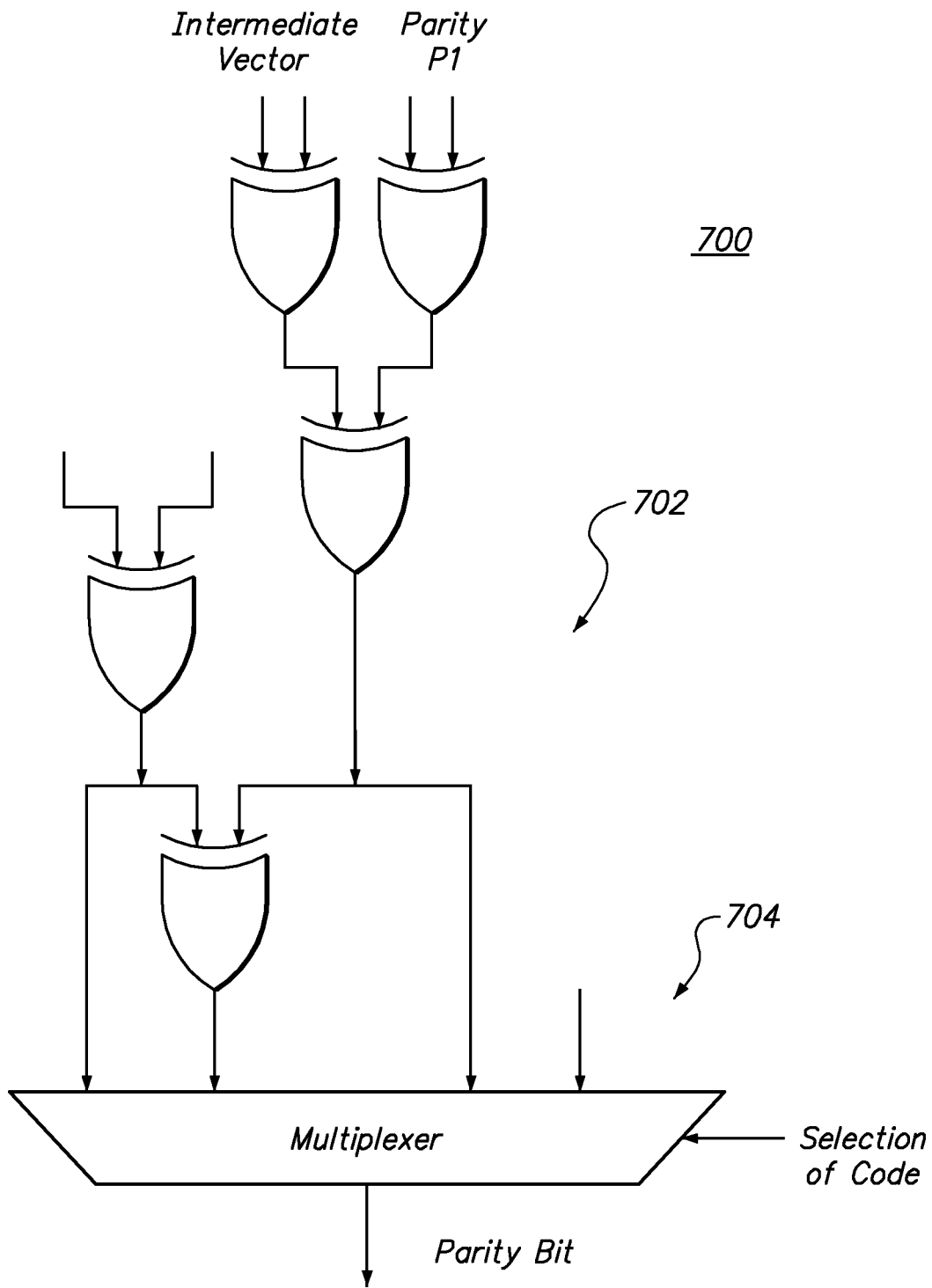
FIG. 7 illustrates XOR hardware resources that are shared among different error correction codes in accordance with an embodiment of the present invention.

FIG. 7 illustrates XOR hardware resources 700 that are shared among different error correction codes in accordance with an embodiment of the present invention. The XOR hardware resources that generate each parity bit include an array of XOR logic gates 702 and one or more multiplexers 704. As shown in FIG. 7, the bits from the intermediate parity bits vector $p_1$, are applied to inputs of the array of XOR logic gates 702. Outputs of the XOR logic gates 702 are coupled to inputs of a multiplexer 704. A select input to the multiplexer 704 controls which of the inputs of the multiplexer 704 is routed to the output of the multiplexer 704 to thereby form the corresponding parity bit. The select input value corresponds to the particular one of the multiple codes that the encoder is currently implementing.

For purposes of illustration, the hardware resources 700 are shown in simplified form for single parity bit. The particular arrangement of the XOR logic gates 702 and multiplexers 704 will depend upon each of the block lengths and code rates to be implemented by the encoder as well as the particular locations of the ones and zeros in the parity check sub-matrices for each such code. Common sub-expression solving techniques can be used to generate the particular arrangement of the hardware resources 700. The common sub-expression solving techniques can be performed using the corresponding $(H_2^T)^{-1}$ sub-matrices of the supported codes. Once the particular arrangement of the hardware resources is determined, the arrangement can be fixed. Only the parity values applied as inputs and the select inputs to the multiplexers need to be changed so that the hardware resources are capable of encoding a different code having a different block length and/or a different rate.

The common parts of the columns of the XOR trees that implement Equation (3), for the case of multiple supported codes by a communication system, are commonly shared during encoding each of these codes, resulting in an overall reduction of the encoder hardware requirements. This contributes to non-negligible decrease of the complexity and area of the encoder architecture. Specifically, embodiments of the present invention may support encoding in accordance with IEEE standard 802.11, and thus the multiple supported codes may include LDPC codes with block lengths selected from 648, 1296, and 1944 bits and with code rates selected from ½, ⅔, ¾ and ⅚.

As an illustrative example, assume the case of a code wherein the parity check matrix is $$H = \begin{bmatrix} 1 & 0 & 1 & 1 & 1 & 0 \\ 0 & 1 & 1 & 0 & 1 & 1 \\ 1 & 0 & 1 & 0 & 0 & 1 \end{bmatrix}.$$

Matrix H is partitioned into two sub-matrices $H=[H_1|H_2]$, where $$H_1 = \begin{bmatrix} 1 & 0 & 1 \\ 0 & 1 & 1 \\ 1 & 0 & 1 \end{bmatrix} \text{ and } H_2 = \begin{bmatrix} 1 & 1 & 0 \\ 0 & 1 & 1 \\ 0 & 0 & 1 \end{bmatrix}.$$

Since the transposed $H_1$ is $$H_1^T = \begin{bmatrix} 1 & 0 & 1 \\ 0 & 1 & 0 \\ 1 & 1 & 1 \end{bmatrix}$$

the elements of the intermediate parity vector $p_1=[p_1(1)\ p_1(2)\ p_1(3)]$ (given by Equation (2)) are computed by the following expressions $p_1(1)=s_1 \otimes s_3$, $p_1(2)=s_2 \otimes s_3$, $p_1(3)=s_1 \otimes s_3$, where $s=[s_1\ s_2\ s_3]$ is the message vector and $\otimes$ denotes the exclusive or (XOR) operation.

Figure 8:
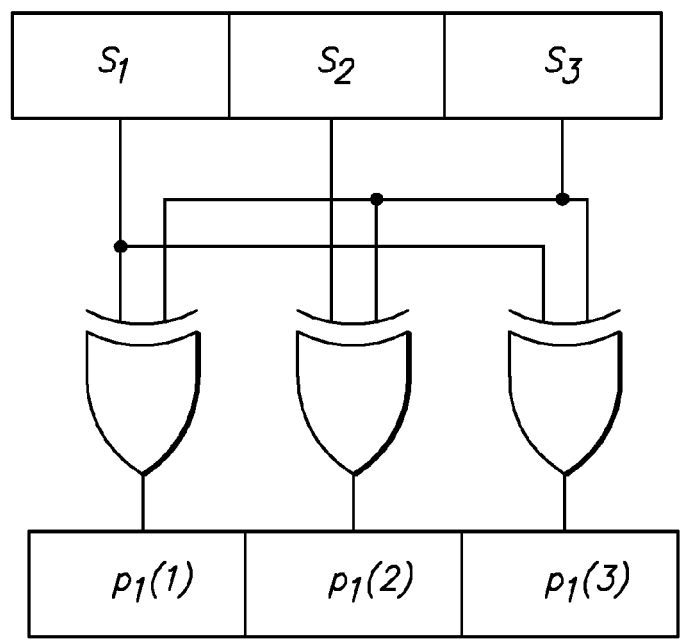
FIG. 8 illustrates an exemplary hardware implementation for generating the intermediate parity bits vector in accordance with an embodiment of the present invention.

A possible hardware implementation of the above equations is depicted in FIG. 8 and is obtained by mapping each XOR operation to a two-input XOR gate. Thus, FIG. 8 illustrates an exemplary hardware implementation for generating the intermediate parity bits vector $p_1$. It will be apparent that further logic-level optimizations are possible.

Returning to the foregoing example, we show how Equation (3) can be implemented in hardware. Initially, the transposed $H_2$ is inverted in the Galois field GF(2) to give $$(H_2^T)^{-1} = \begin{bmatrix} 1 & 0 & 0 \\ 1 & 1 & 0 \\ 1 & 1 & 1 \end{bmatrix}$$

and subsequently the row-vector by matrix product of Equation (3) is evaluated to give the elements of the parity vector p $p(1)=p_1(1) \otimes p_1(2) \otimes p_1(3)$, $p(2)=p_1(2) \otimes p_1(3)$, $p(3)=p_1(3)$.

Figure 9:
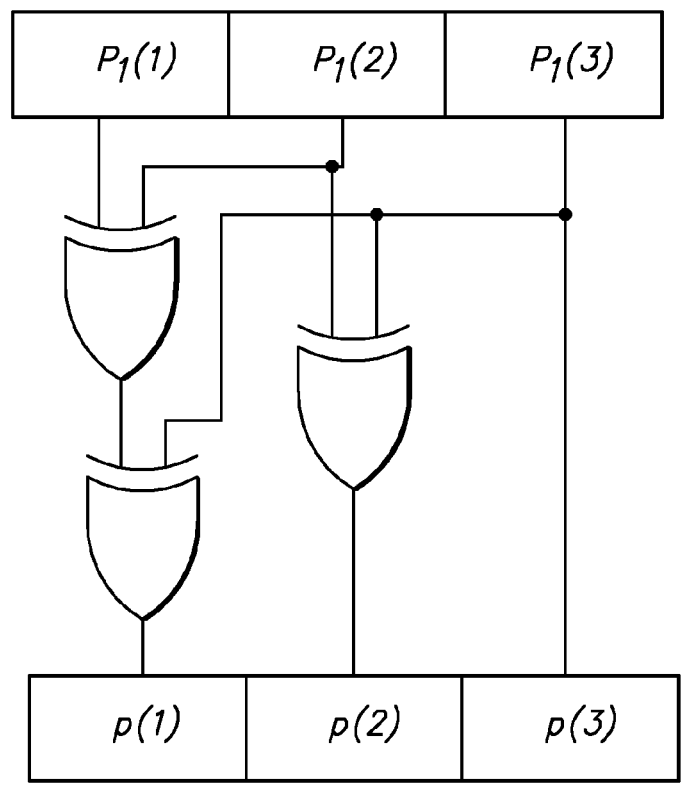
FIG. 9 illustrates an exemplary hardware implementation for generating the parity bits vector in accordance with an embodiment of the present invention.

The corresponding hardware implementation is depicted in FIG. 9. Thus, FIG. 9 illustrates an exemplary hardware implementation for generating the parity bits vector in accordance with Equation (3).

As an example of resource sharing, consider an architecture that supports four codes, namely A, B, C and D. Let the first parity bit $p_j(1)$, j=A, B, C, D of each code be computed according to $$p_A(1)=p_1(1) \otimes p_1(2),$$

$$p_B(1)=p_1(1) \otimes p_1(2) \otimes p_1(3),$$

$$p_C(1)=p_1(1) \otimes p_1(2) \otimes p_1(3) \otimes p_1(4) \otimes p_1(5),$$

$$p_D(1)=p_1(1) \otimes p_1(2) \otimes p_1(3) \otimes p_1(5) \otimes p_1(6) \otimes p_1(7).$$

Figure 10:
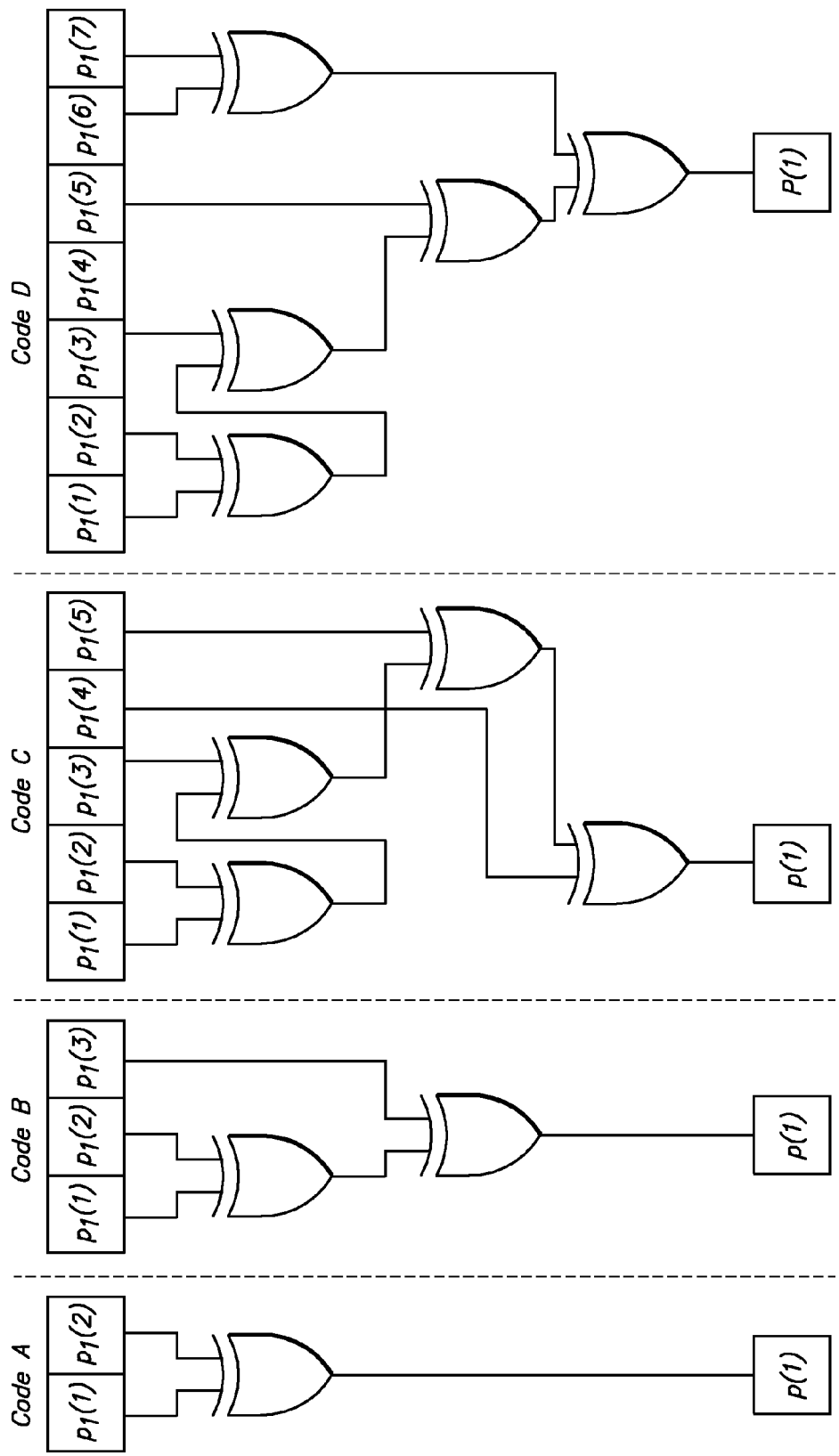
FIG. 10 illustrates exemplary hardware implementations for generating a parity bit for each of four error correction codes to which hardware resource sharing in accordance with embodiments of the present invention can be applied.

In this example, the first column of each of the inverted transposed parity check sub-matrices, corresponding to each code can be $$(H_2^T)_A^{-1}(1) = \begin{bmatrix} 1 \\ 1 \\ 0 \\ 0 \\ 0 \\ 0 \end{bmatrix} (H_2^T)_B^{-1}(1) = \begin{bmatrix} 1 \\ 1 \\ 1 \\ 0 \\ 0 \\ 0 \end{bmatrix} (H_2^T)_C^{-1}(1) = \begin{bmatrix} 1 \\ 1 \\ 1 \\ 1 \\ 0 \\ 0 \end{bmatrix} (H_2^T)_D^{-1}(1) = \begin{bmatrix} 1 \\ 1 \\ 1 \\ 0 \\ 1 \\ 1 \end{bmatrix},$$

where common rows can be identified as described herein. Using the design method described herein, four circuits, one for each code, are obtained and shown in FIG. 10. FIG. 10 illustrates exemplary hardware implementations for generating a parity bit as in Equation (3) for each of four different error correction codes.

The hardware implementation of FIG. 10 requires twelve (12) XOR gates. The present invention reduces hardware by reusing partial results. We initially identify common sub-expressions in the equations that derive the parity bit values. In this example, we notice that the value of $p_A(1)$ can be reused per se in the computation of $p_B(1)$ allowing us to write $$p_A(1)=p_1(1) \otimes p_1(2),$$

$$p_B(1)=p_A(1) \otimes p_1(3),$$

Furthermore by defining $g=p_B(1) \otimes p_1(5)$ the computation of $p_C(1)$ and $p_D(1)$ is written as $$p_C(1)=g \otimes p_1(4),$$

$$p_D(1)=g \otimes p_1(6) \otimes p_1(7),$$

where $p_X(n)$ denotes the n-th parity bit for the case of code X.

Figure 11:
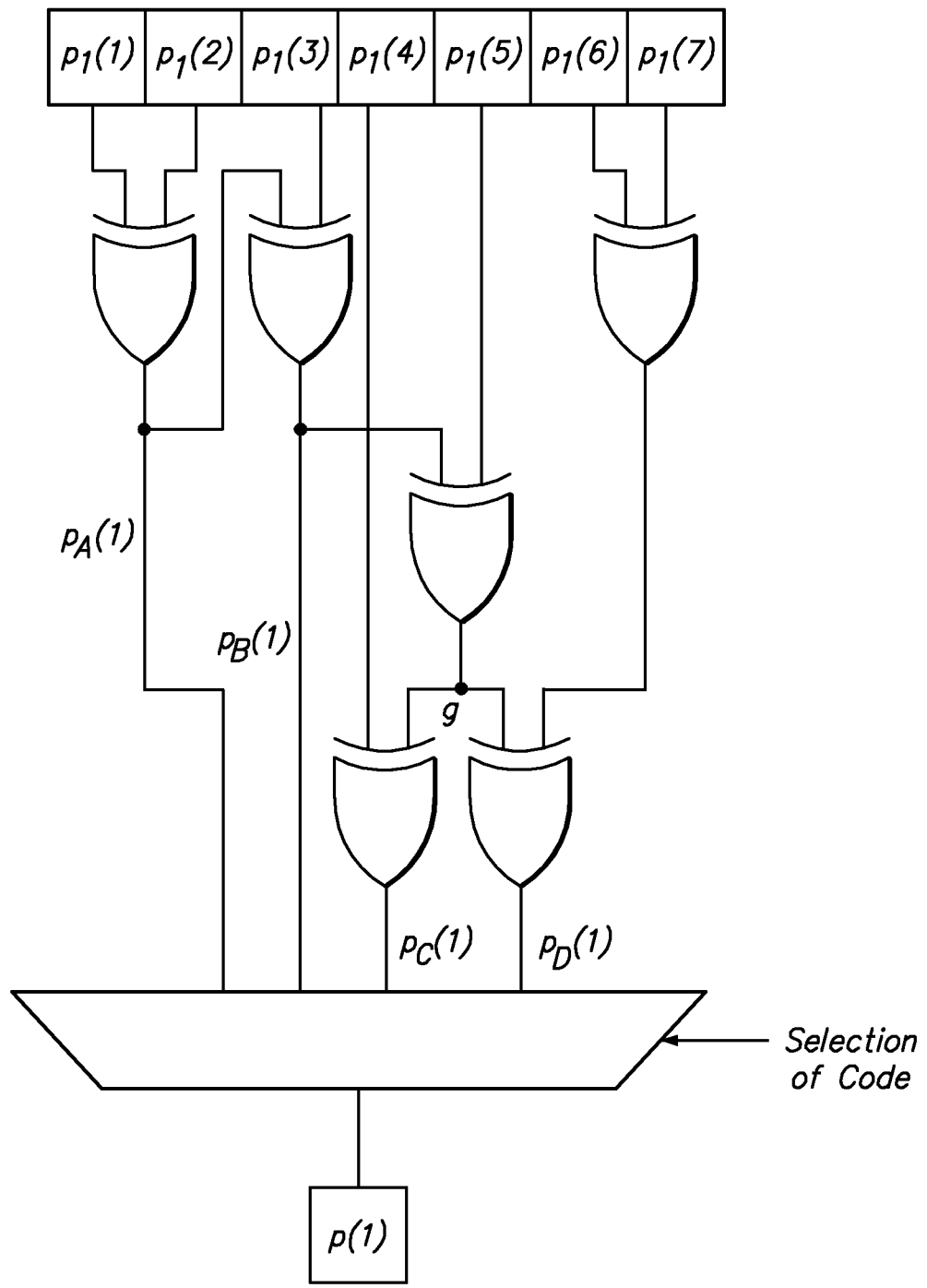
FIG. 11 illustrates an exemplary hardware implementation in which hardware resources are shared among four different error correction codes in accordance with an embodiment of the present invention.

A possible hardware implementation of the modified equations that use common subexpression sharing is depicted in FIG. 11. In this example it can be seen that only six (6) two-input XOR gates are required, compared to the twelve (12) gates required in FIG. 10. Thus, FIG. 11 illustrates an exemplary hardware implementation in which hardware resources are shared among four different error correction codes. The circuit of FIG. 11 can produce a parity bit for a code of choice at each instance.

In the examples above, the parity bits are generated by separate XOR trees. In some embodiments, the XOR gates may also be shared among different parity bits. It is possible to share XOR gates among different trees that compute parity bits for the same or a different supported code, as illustrated in the following example.

Let the third parity bit for code B be $p_B(3)$ and the sixth parity bit for code C be $p_C(6)$. Furthermore, assume that the particular parity bits are computed as $$p_B(3)=p_1(1) \otimes p_1(3) \text{ and}$$

$$p_C(6)=p_1(1) \otimes p_1(3) \otimes p_1(6)=p_B(3) \otimes p_1(6).$$

Figure 12:
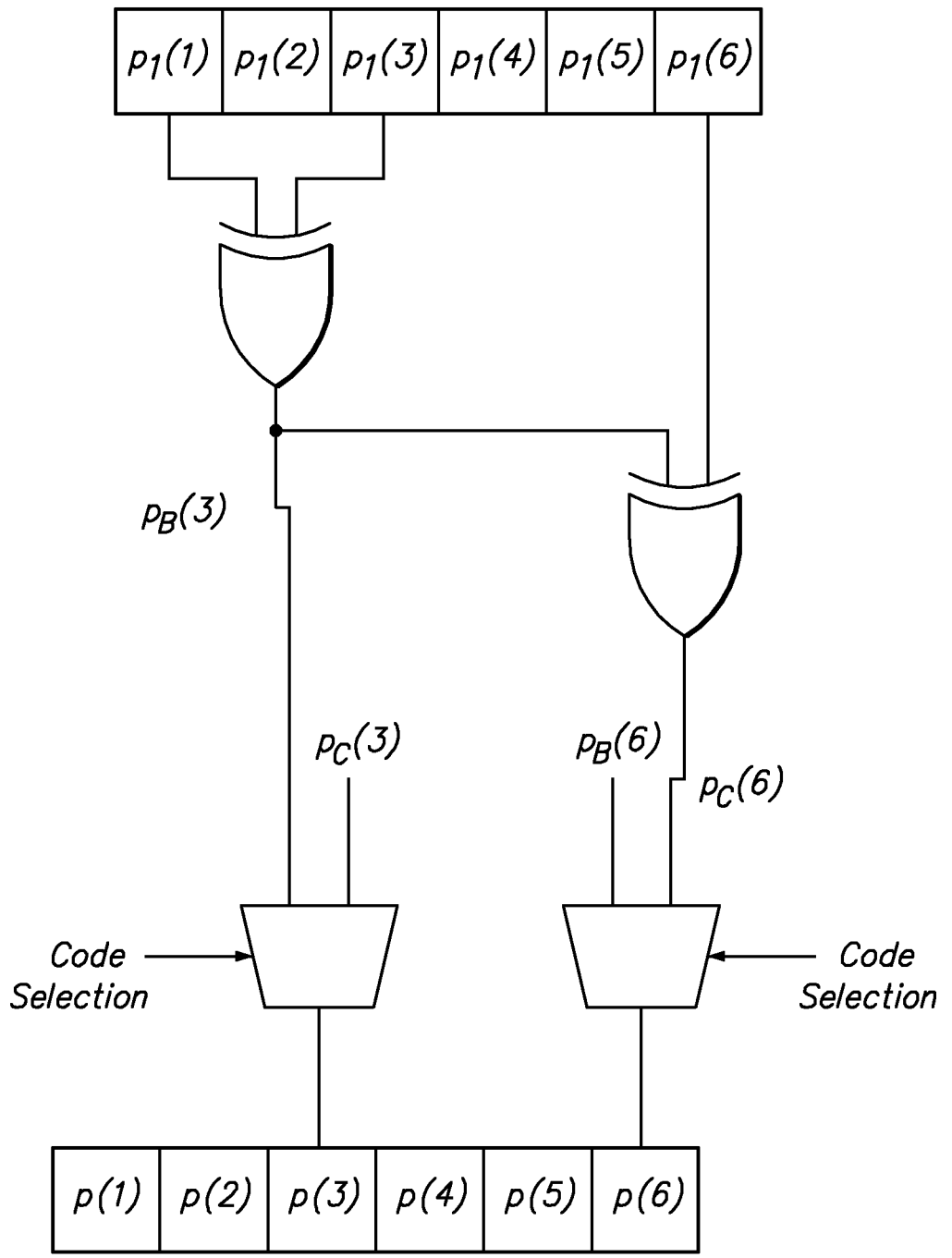
FIG. 12 illustrates an exemplary hardware implementation in which hardware resources are shared among different parity bits of different error correction codes in accordance with an embodiment of the present invention.

Notice that the first expression above is reused in the second expression. FIG. 12 indicates the corresponding hardware portion sharing. More particularly, FIG. 12 illustrates an exemplary hardware implementation in which hardware resources are shared among different parity bits of different error correction codes.

In case that hardware is shared among XOR trees for different parity bits and/or codes corresponding logic is required to select the appropriate output bit for each case, as shown in FIG. 12. In case the codes are of different length some selection logic can be omitted. Thus, in the example above, if code B has only three parities, the selection logic for the sixth parity bit can be omitted.

The foregoing detailed description of the present invention is provided for the purpose of illustration and is not intended to be exhaustive or to limit the invention to the embodiments disclosed. Accordingly, the scope of the present invention is defined by the appended claims.

What is claimed is:

1. A method of encoding an error correction code, comprising steps of:
   computing an intermediate parity bits vector from a message bits vector using a sub-matrix of a parity check matrix; and
   computing a parity bits vector from the intermediate parity bits vector using fixed hardware resources comprising logic gate trees that are configured to compute parity bits for multiple different codes and wherein an arrangement for the hardware resources is determined from a common sub-expression solution such that portions of the hardware resources that are configured to compute the parity bits for a particular one of the codes are commonly shared with portions of the hardware resources that are configured to compute the parity bits for another particular one of the codes.

2. The method according to claim 1, wherein the parity check matrix is partitioned and transposed to form the sub-matrix.

3. The method according to claim 1, wherein the sub-matrix used for said computing the intermediate parity bits vector comprises a first sub-matrix of the parity check matrix and wherein the common sub-expression solution is determined using an inversion of a second sub-matrix of the parity check matrix.

4. The method according to claim 3, wherein the parity check matrix is partitioned and transposed to form the second sub-matrix.

5. The method according to claim 1, wherein hardware resources are shared among different parity bits of different error correction codes.

6. The method according to claim 1, wherein the hardware resources comprise an array of logic XOR gates.

7. The method according to claim 6, wherein the commonly shared portions of the hardware resources comprise commonly shared XOR logic gates.

8. The method according to claim 6, wherein the hardware resources comprise multiplexers, one for each of the parity bits of the parity bits vector.

9. The method according to claim 1, wherein the multiple different codes differ in at least their block lengths or code rates.

10. The method according to claim 1, generating a codeword in accordance with an error correction code from the parity bits vector and the message bits vector.

11. The method according to claim 10, wherein the error correction code is a low density parity check (LDPC) code.

12. An encoder for error correction coding, comprising:
first hardware resources configured to receive a message bits vector and to compute an intermediate parity bits vector from the message bits vector wherein the intermediate parity bits vector is computed based on a sub-matrix of a parity check matrix; and
second hardware resources configured to compute a parity bits vector from the intermediate parity bits vector, wherein the second hardware resources comprise logic gate trees that are configured to compute parity bits for multiple different codes and wherein an arrangement for the hardware resources is determined from a common sub-expression solution such that portions of the hardware resources that are configured to compute the parity bits for a particular one of the codes are commonly shared with portions of the hardware resources that are configured to compute the parity bits for another particular one of the codes.

13. The encoder according to claim 12, wherein the parity check matrix is partitioned and transposed to form the sub-matrix.

14. The encoder according to claim 12, wherein the sub-matrix comprises a first sub-matrix of the parity check matrix and wherein the common sub-expression solution is based on an inversion of a second sub-matrix of the parity check matrix.

15. The encoder according to claim 14, wherein the parity check matrix is partitioned and transposed to form the second sub-matrix.

16. The encoder according to claim 12, wherein portions of the hardware resources are shared among different parity bits of different error correction codes.

17. The encoder according to claim 12, wherein the second hardware resources comprise an array of logic XOR gates.

18. The encoder according to claim 17, wherein the commonly shared portions of the second hardware resources comprise commonly shared XOR logic gates.

19. The encoder according to claim 17, wherein the second hardware resources comprise multiplexers, one for each of the parity bits of the parity bits vector.

20. The encoder according to claim 12, wherein the multiple different codes differ in at least their block lengths or code rates.

21. The encoder according to claim 12, wherein the encoder is configured to generate a codeword in accordance with an error correction code from the parity bits vector and the message bits vector.

22. The encoder according to claim 21, wherein the error correction code is a low density parity check (LDPC) code.

* * * * *

UNITED STATES PATENT AND TRADEMARK OFFICE
CERTIFICATE OF CORRECTION

Page 1 of 1

PATENT NO. : 9,003,257 B1
APPLICATION NO. : 14/031505
DATED : April 7, 2015
INVENTOR(S) : Ahmed S. Mahdi et al.

It is certified that error appears in the above-identified patent and that said Letters Patent is hereby corrected as shown below:

IN THE DRAWINGS

Please replace Fig. 4 with the following new Fig. 4:

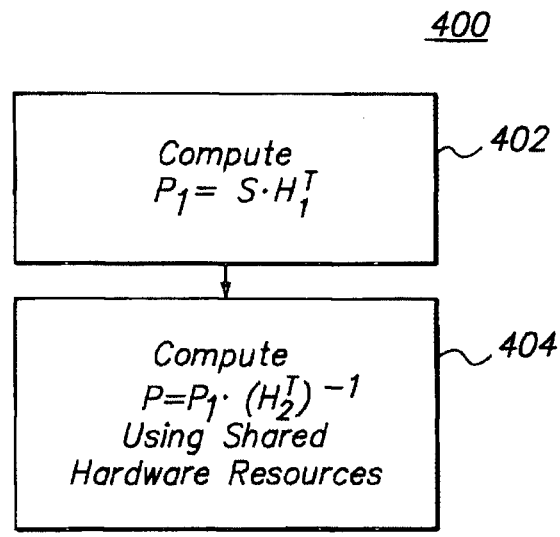

*FIG. 4*

Signed and Sealed this
Sixth Day of October, 2015

Michelle K. Lee
*Director of the United States Patent and Trademark Office*